(12) United States Patent
Xi et al.

(10) Patent No.: US 7,700,985 B2
(45) Date of Patent: Apr. 20, 2010

(54) FERROELECTRIC MEMORY USING MULTIFERROICS

(75) Inventors: Haiwen Xi, Prior Lake, MN (US); Wei Tian, Bloomington, MN (US); Yang Li, Shoreview, MN (US); Insik Jin, Eagan, MN (US); Song S. Xue, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 12/144,697

(22) Filed: Jun. 24, 2008

(65) Prior Publication Data

US 2009/0315088 A1    Dec. 24, 2009

(51) Int. Cl.
*H01L 29/94* (2006.01)
*G11C 16/06* (2006.01)
(52) U.S. Cl. .................................. 257/297; 365/185.22
(58) Field of Classification Search ................. 257/295, 257/E27.104, E29.272, E21.208, E21.436, 257/E21.663, E21.664, 297; 369/126; 438/3; 365/185.22
See application file for complete search history.

(56) References Cited

U.S. PATENT DOCUMENTS

| | | | |
|---|---|---|---|
| 2,791,760 | A | 5/1957 | Ross |
| 6,584,008 | B2 | 6/2003 | Ishiwara |
| 7,238,978 | B2 | 7/2007 | Migazawa |
| 2004/0095658 | A1* | 5/2004 | Buretea et al. .............. 359/853 |
| 2007/0020856 | A1 | 1/2007 | Sadd |
| 2008/0024910 | A1 | 1/2008 | Seigler |
| 2008/0145693 | A1* | 6/2008 | Zou et al. ................... 428/611 |
| 2009/0040808 | A1* | 2/2009 | Krieger ...................... 365/145 |
| 2009/0050949 | A1* | 2/2009 | Maruyama et al. .......... 257/295 |

FOREIGN PATENT DOCUMENTS

| | | |
|---|---|---|
| EP | 1 191 604 | 3/2002 |
| WO | WO 2007/110950 | * 10/2007 |
| WO | WO 2007/149003 | * 12/2007 |

OTHER PUBLICATIONS

Srinivasan, et al., "Magnetoelectric effects in ferrite-lead zirconate titanate layered composites . . . ", 2003, Physical Review B 67, pp. 014418-1-10.*

Liu et al., "A modified sol-gel process for multiferroic nanocomposite film", 2007, Journal of Applied Physics, vol. 102, pp. 083911-1-3.*

(Continued)

*Primary Examiner*—Thomas L Dickey
*Assistant Examiner*—Nikolay Yushin
(74) *Attorney, Agent, or Firm*—Cambell Nelson Whipps, LLC

(57) ABSTRACT

Ferroelectric memory using multiferroics is described. The multiferroic memory includes a substrate having a source region, a drain region and a channel region separating the source region and the drain region. An electrically insulating layer is adjacent to the source region, drain region and channel region. A data storage cell having a composite multiferroic layer is adjacent to the electrically insulating layer. The electrically insulating layer separated the data storage cell form the channel region. A control gate electrode is adjacent to the data storage cell. The data storage cell separates at least a portion of the control gate electrode from the electrically insulating layer.

12 Claims, 3 Drawing Sheets

OTHER PUBLICATIONS

Levin et al., "Design of Self-Assembled Multiferroic Nanostructures in Epitaxial Films", 2006, Advanced Material, vol. 18, pp. 2044-2047.*

PCT Search Report and Written Opinion dated Jun. 24, 2009.

Wakiya N. et al., Orientation Control and Properties of Pb(Zr,Ti)O3, Thin Films Deposited on Ni-Zn-ferrite for Novel Ferroelectric/Ferromagnetic Memory Applications, Jap. Journal of Applied Science, vol. 41, No. 11b, Nov. 2002 (pp. 7242-7248.

Igor Levin, et al., Design of Self-Assembled Multiferroic Nanostructures in Epitaxial Filsm, Advanced Materials, vol. 18, No. 15, Jul. 10, 2005, pp. 2044-2047.

Meyer et al., Hysteretic Resistance Concepts in Ferroelectric Thin Films, Journal of Applied Physics 100, 051611 (2006).

T. P. Ma et al., Why is Nonvolatile Ferroelectric Memory Field-Effect Transistor Still Elusive?, IEEE Electron Device Letters, vol. 23, No. 7, Jul. 2002.

Fiebig, Revival of the Magnetoelectric Effect, Journal of Physics D: Applied Physics 38 (2005) R123-R152.

Zheng et al., Multiferroic BaTiO3-CoFe2O4 Nanostructures, Science 303, 661 (2004).

Ishiwara, Recent Progress in FET-type Ferroelectric Memories, IEEE 2003 (10.3.1-10.3.4).

Ishiwara, Current Status and Prospects of Ferroelectric Memories, IEEE 2001 (33.1.1-33.1.4).

Nan et al., Multiferroic Magnetoelectric Composites: Historical Perspective, Status, and Future Directions, Journal of Applied Physics 103, 031101 (2008).

* cited by examiner

FERROELECTRIC MEMORY USING MULTIFERROICS

BACKGROUND

Ferroelectric field-effect transistors has been considered to be an ideal technology for nonvolatile memory because of its random access, high speed, low power, high density and simplicity. In addition, the read operation is non-destructive. The device can be considered as a ferroelectric layer inserted in a field-effect transistor between a gate contact and an insulator layer above a channel between a source region and a drain region When the ferroelectric field-effect transistor (i.e., FeFET) is biased, the existence of a channel current from the source region to the drain region depends on the polarization of the ferroelectric layer. The write operation simply applies voltage on the gate relative to the source region and drain region. When the write voltage exceeds the coercive field of the ferroelectric layer, the polarization will change, writing data to the FeFET.

Although FeFET memory has been researched for a number of year, FeFET memory is not yet commercially available. One problem with FeFET memory is poor data retention, which is understood to be a result of the depolarization field and current leakage, which compensates the ferroelectric polarization. In practice, FeFET memory has not been able to achieve memory retention for more than a couple of days, which is a far cry from the ten year retention standard of many nonvolatile memory devices.

BRIEF SUMMARY

The present disclosure relates to ferroelectric memory. In particular, present disclosure relates to ferroelectric memory using multiferroics. In many embodiments, a multiferroic memory unit including a substrate having a source region, a drain region and a channel region separating the source region and the drain region. An electrically insulating layer is adjacent to the source region, drain region and channel region. A data storage cell having a composite multiferroic layer is adjacent to the electrically insulating layer. The electrically insulating layer separated the data storage cell form the channel region. A control gate electrode is adjacent to the data storage cell. The data storage cell separates at least a portion of the control gate electrode from the electrically insulating layer.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to ferroelectric memory. In particular, present disclosure relates to ferroelectric memory using multiferroics or composite multiferroics. In many embodiments, a multiferroic memory unit including a substrate having a source region, a drain region, and a channel region separating the source region from the drain region, and an electrically insulating layer is adjacent to the substrate. A control gate electrode is adjacent to the electrically insulating layer and the source region and the drain region. A data storage cell includes a composite multiferroic layer and is between the insulating layer and the control gate electrode. An element that includes a material that possesses an electric polarization and a material that possesses a magnetic magnetization simultaneously is herein termed a composite multiferroic element. The composite multiferroic layer includes a ferromagnetic material and a ferroelectric material. These two materials improve data retention issues by reducing the depolarization field, enhance the polarization stability, and reduce the current leakage of the ferroelectric memory unit. While the present disclosure is not so limited, an appreciation of various aspects of the disclosure will be gained through a discussion of the examples provided below.

Figure 1:
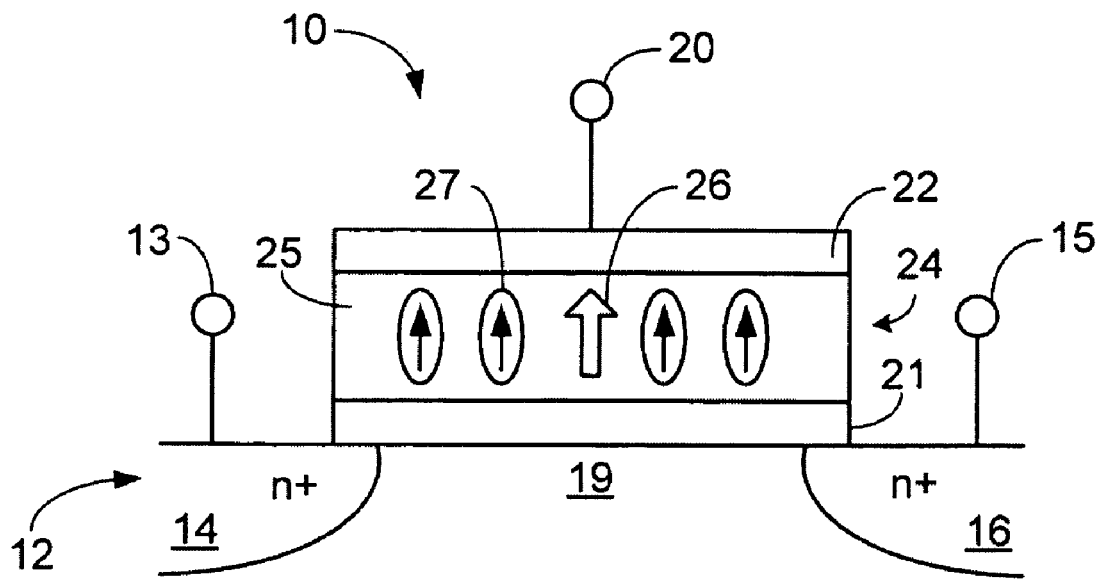
FIG. 1 is a cross-sectional schematic diagram of an illustrative ferroelectric memory unit.

FIG. 1 is a cross-sectional schematic diagram of an illustrative ferroelectric memory unit. The ferroelectric memory unit is a multiferroic memory unit 10. The multiferroic memory unit 10 includes a substrate 12 having a source region 14, a drain region 16 and a channel region 19 between or separating the source region 14 from the drain region 16. An electrically insulating layer 21 is adjacent to the substrate 12. A data storage cell 24 is adjacent to the electrically insulating layer 21 and the electrically insulating layer 21 separates the data storage cell 24 from the channel region 19. A control gate electrode 22 is adjacent to the data storage cell 24. The data storage cell 24 includes a composite multiferroic layer 25. The data storage cell 24 separates at least a portion of the insulating layer 21 from the control gate electrode 22. This multiferroic memory unit 10 can be described as a MFIS structure.

The control gate electrode 22 can be electrically coupled to a gate voltage source 20. The source region 14 can be electrically coupled to a source region voltage source 13 or to ground. The drain region 16 can be electrically coupled to a drain region voltage source 15 or to ground. In many embodiments, these connections can be facilitated in any useful manner such as, for example, via bit lines and/or word lines of the memory device array.

The MFIS structure refers to: M: metal or conductor; F: ferroelectric; I: insulator; S: semiconductor. The metal or conductor is the control gate electrode 22. The ferroelectric layer is the composite multiferroic layer 25. The insulator is the electrically insulating layer 21 and the semiconductor is the substrate 12 having a source region 14, a drain region 16 and a channel region 19 between or separating the source region 14 from the drain region 16. The semiconductor substrate can be formed of any useful material where the source region 14 and a drain region 16 is doped with the appropriate n or p dopant. The illustrated embodiment has the source region 14 and a drain region 16 is doped with an n dopant, however the disclosure is not limited to this.

The formation of a junction between the semiconductor and a ferroelectric can create, depending on the polarization direction of the ferroelectric, a state in which electrons are induced to the semiconductor surface, or a state in which holes are induced. Non-volatile memory devices which hold memory contents even after power-off operation can be formed by using a composite multiferroic layer 25 for the gate insulator film of a MOS field effect transistor and making the two states correspond to "O" and "I". The memory unit 10 of this structure can also be used for an analog memory device. However, for descriptive convenience, the operation will be described by exemplifying a case in which the memory unit 10 is used for a digital memory device. Although not shown, memory units 10 can be arranged in a matrix to form a memory array.

FIG. 1 illustrates composite multiferroic layer 25 including a ferromagnetic material 27 in a matrix of a ferroelectric material 26. This composite multiferroic layer 25 possesses a magneto-electric (ME) effect, which means the coupling between electric and magnetic fields and allows for additional degrees of freedom to control electric polarization by magnetic fields or to control magnetization by and electric field. FIG. 1 illustrates a composite multiferroic layer 25 where the polarization of the ferroelectric is coupled with the magnetization of the ferromagnetic particles. The ferromagnetic particles can be nanorods extending between the control gate electrode 22 and the insulating layer 21.

Figure 2:
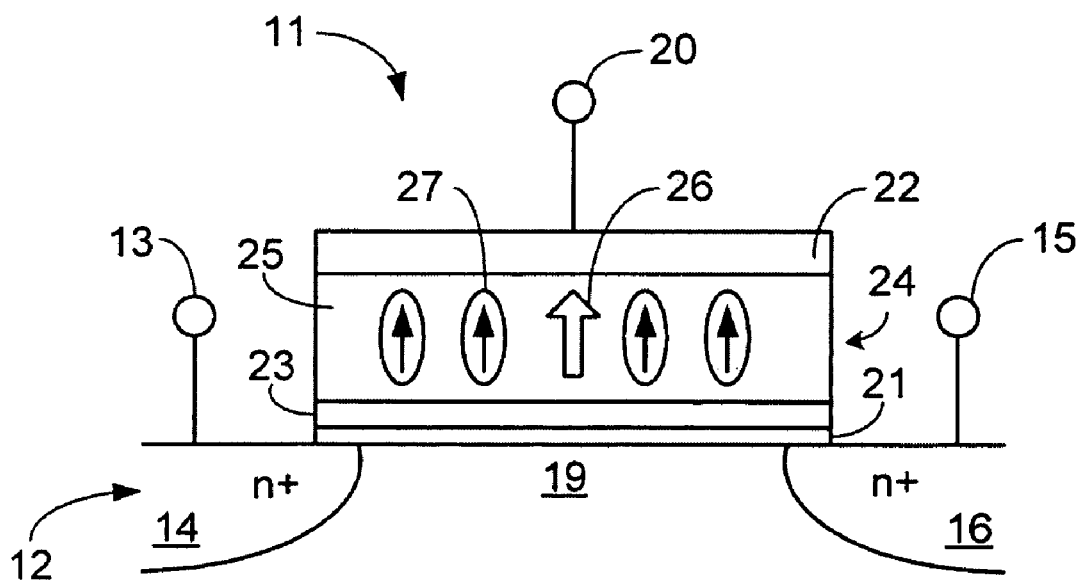
FIG. 2 is a cross-sectional schematic diagram of another illustrative ferroelectric memory unit.

FIG. 2 is a cross-sectional schematic diagram of another illustrative ferroelectric memory unit. The ferroelectric memory unit is a multiferroic memory unit 11. The multiferroic memory unit 11 includes a substrate 12 having a source region 14, a drain region 16 and a channel region 19 between or separating the source region 14 from the drain region 16. An electrically insulating layer 21 is adjacent to the substrate 12. A data storage cell 24 is adjacent to the electrically insulating layer 21 and the electrically insulating layer 21 separates the data storage cell 24 from the channel region 19. A control gate electrode 22 is adjacent to the data storage cell 24. The data storage cell 24 includes a composite multiferroic layer 25. The data storage cell 24 separates at least a portion of the electrically insulating layer 21 from the control gate electrode 22. An electrically conducting layer 23 separates at least a portion of the electrically insulating layer 21 from the data storage cell 24. This multiferroic memory unit 11 can be described as a MFMIS structure.

The control gate electrode 22 can be electrically coupled to a gate voltage source 20. The source region 14 can be electrically coupled to a source region voltage source 13 or to ground. The drain region 16 can be electrically coupled to a drain region voltage source 15 or to ground. In many embodiments, these connections can be facilitated in any useful manner such as, for example, via bit lines and/or word lines of the memory device array.

The MFMIS structure refers to: M: metal or conductor; F: ferroelectric; M: metal or conductor; I: insulator; S: semiconductor. The first metal or conductor is the control gate electrode 22. The ferroelectric layer is the composite multiferroic layer 25. The second metal or conductor is the electrically conducting layer 23. The insulator is the electrically insulating layer 21 and the semiconductor is the substrate 12 having a source region 14, a drain region 16 and a channel region 19 between or separating the source region 14 from the drain region 16. The semiconductor substrate can be formed of any useful material where the source region 14 and a drain region 16 is doped with the appropriate n or p dopant. The illustrated embodiment has the source region 14 and a drain region 16 is doped with an n dopant, however the disclosure is not limited to this.

The formation of a junction between the semiconductor and a ferroelectric can create, depending on the polarization direction of the ferroelectric, a state in which electrons are induced to the semiconductor surface, or a state in which holes are induced. Non-volatile memory devices which hold memory contents even after power-off operation can be formed by using a composite multiferroic layer 25 for the gate insulator film of a MOS field effect transistor and making the two states correspond to "O" and "I". The memory unit 11 of this structure can also be used for an analog memory device. However, for descriptive convenience, the operation will be described by exemplifying a case in which the memory unit 11 is used for a digital memory device. Although not shown, memory units 11 can be arranged in a matrix to form a memory array.

FIG. 2 illustrates composite multiferroic layer 25 including a ferromagnetic material 27 in a matrix of a ferroelectric material 26. This composite multiferroic layer 25 possesses a magneto-electric (ME) effect, which means the coupling between electric and magnetic fields and allows for additional degrees of freedom to control electric polarization by magnetic fields or to control magnetization by and electric field. FIG. 2 illustrates a composite multiferroic layer 25 where the polarization of the ferroelectric is coupled with the magnetization of the ferromagnetic particles. The ferroelectric particles can be nanorods extending between and in contact with the control gate electrode 22 and the electrically conducting layer 23.

Figure 3:
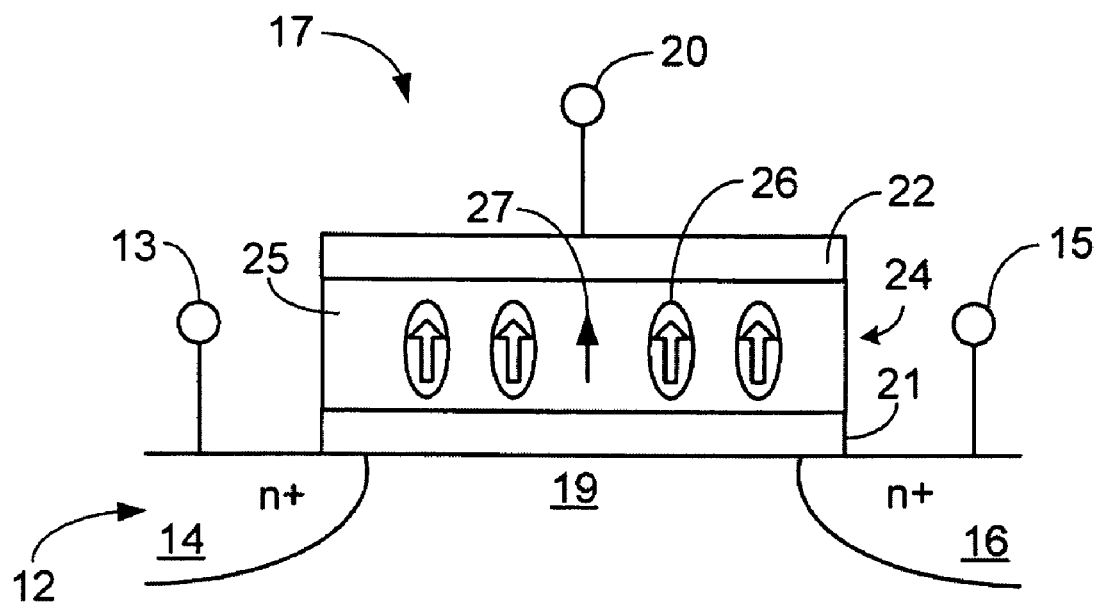
FIG. 3 is a cross-sectional schematic diagram of another illustrative ferroelectric memory unit.

FIG. 3 is a cross-sectional schematic diagram of another illustrative ferroelectric memory unit. The ferroelectric memory unit is a multiferroic memory unit 17. The multiferroic memory unit 10 includes a substrate 12 having a source region 14, a drain region 16 and a channel region 19 between or separating the source region 14 from the drain region 16. An electrically insulating layer 21 is adjacent to the substrate 12. A data storage cell 24 is adjacent to the electrically insulating layer 21 and the electrically insulating layer 21 separates the data storage cell 24 from the channel region 19. A control gate electrode 22 is adjacent to the data storage cell 24. The data storage cell 24 includes a composite multiferroic layer 25. The data storage cell 24 separates at least a portion of the insulating layer 21 from the control gate electrode 22. This multiferroic memory unit 10 can be described as a MFIS structure, as described above.

The control gate electrode 22 can be electrically coupled to a gate voltage source 20. The source region 14 can be electrically coupled to a source region voltage source 13 or to ground. The drain region 16 can be electrically coupled to a drain region voltage source 15 or to ground. In many embodiments, these connections can be facilitated in any useful manner such as, for example, via bit lines and/or word lines of the memory device array.

The formation of a junction between the semiconductor and a ferroelectric can create, depending on the polarization direction of the ferroelectric, a state in which electrons are induced to the semiconductor surface, or a state in which holes are induced. Non-volatile memory devices which hold memory contents even after power-off operation can be formed by using a composite multiferroic layer 25 for the gate insulator film of a MOS field effect transistor and making the two states correspond to "O" and "I". The memory unit 17 of this structure can also be used for an analog memory device. However, for descriptive convenience, the operation will be described by exemplifying a case in which the memory unit 17 is used for a digital memory device. Although not shown, memory units 17 can be arranged in a matrix to form a memory array.

FIG. 3 illustrates composite multiferroic layer 25 including a ferroelectric material 26 in a matrix of a ferromagnetic material 27. This composite multiferroic layer 25 possesses a magneto-electric (ME) effect, which means the coupling between electric and magnetic fields and allows for additional degrees of freedom to control electric polarization by magnetic fields or to control magnetization by and electric field. FIG. 3 illustrates a composite multiferroic layer 25 where the magnetization of the ferromagnetic material is coupled with the polarization of the ferroelectric particles. The ferroelectric particles can be nanorods extending between and in contact with the control gate electrode 22 and the electrically conducting layer 23.

Figure 4:
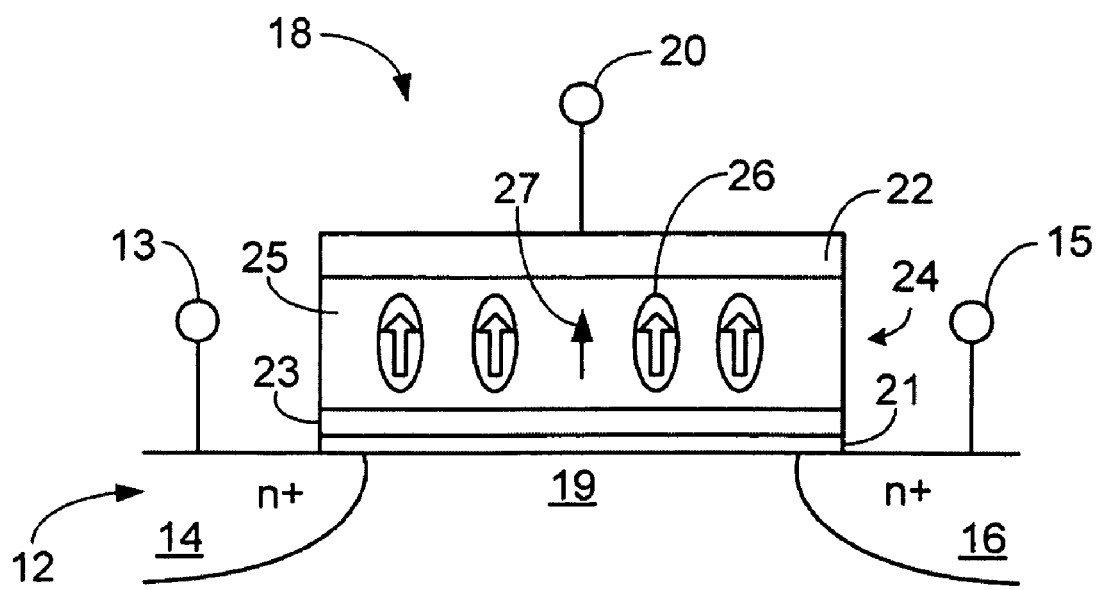
FIG. 4 is a cross-sectional schematic diagram of another illustrative ferroelectric memory unit.

FIG. 4 is a cross-sectional schematic diagram of another illustrative ferroelectric memory unit. The ferroelectric memory unit is a multiferroic memory unit 18. The multiferroic memory unit 11 includes a substrate 12 having a source region 14, a drain region 16 and a channel region 19 between or separating the source region 14 from the drain region 16. An electrically insulating layer 21 is adjacent to the substrate 12. A data storage cell 24 is adjacent to the electrically insulating layer 21 and the electrically insulating layer 21 separates the data storage cell 24 from the channel region 19. A control gate electrode 22 is adjacent to the data storage cell 24. The data storage cell 24 includes a composite multiferroic layer 25. The data storage cell 24 separates at least a portion of the electrically insulating layer 21 from the control gate electrode 22. An electrically conducting layer 23 separates at least a portion of the electrically insulating layer 21 from the data storage cell 24. This multiferroic memory unit 18 can be described as a MFMIS structure, as described above.

The control gate electrode 22 can be electrically coupled to a gate voltage source 20. The source region 14 can be electrically coupled to a source region voltage source 13 or to ground. The drain region 16 can be electrically coupled to a drain region voltage source 15 or to ground. In many embodiments, these connections can be facilitated in any useful manner such as, for example, via bit lines and/or word lines of the memory device array.

The formation of a junction between the semiconductor and a ferroelectric can create, depending on the polarization direction of the ferroelectric, a state in which electrons are induced to the semiconductor surface, or a state in which holes are induced. Non-volatile memory devices which hold memory contents even after power-off operation can be formed by using a composite multiferroic layer 25 for the gate insulator film of a MOS field effect transistor and making the two states correspond to "O" and "I". The memory unit 18 of this structure can also be used for an analog memory device. However, for descriptive convenience, the operation will be described by exemplifying a case in which the memory unit 18 is used for a digital memory device. Although not shown, memory units 18 can be arranged in a matrix to form a memory array.

FIG. 4 illustrates composite multiferroic layer 25 including a ferroelectric material 26 in a matrix of a ferromagnetic material 27. This composite multiferroic layer 25 possesses a magneto-electric (ME) effect, which means the coupling between electric and magnetic fields and allows for additional degrees of freedom to control electric polarization by magnetic fields or to control magnetization by and electric field. FIG. 4 illustrates a composite multiferroic layer 25 where the polarization of the ferroelectric is coupled with the magnetization of the ferromagnetic particles. The ferroelectric particles can be nanorods extending between and in contact with the control gate electrode 22 and the electrically conducting layer 23.

Figure 5:
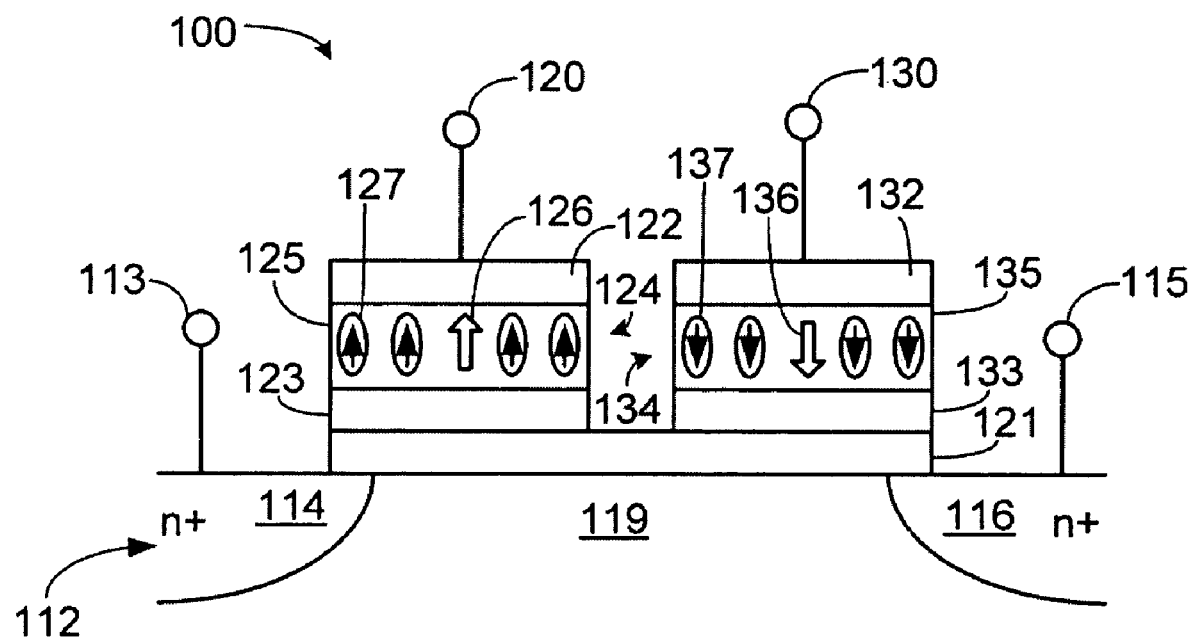
FIG. 5 is a cross-sectional schematic diagram of another illustrative ferroelectric memory unit.

FIG. 5 is a cross-sectional schematic diagram of another illustrative ferroelectric memory unit. The ferroelectric memory unit is a multiferroic memory unit 100. The multiferroic memory unit 100 includes a substrate 112 having a source region 114, the drain region 116 and a channel region 119 between or separating the source region 114 from the drain region 116. An electrically insulating layer 121 is adjacent to the substrate 112. This multiferroic memory unit 100 can be described as a 1T2C structure.

A first control gate electrode 122 is adjacent to the electrically insulating layer 121 and the a channel region 119. A first data storage cell 124 includes a composite multiferroic layer 125. The first data storage cell 124 separates or is at least partially between the insulating layer 121 from the first control gate electrode 122. An optional first electrically conducting layer 123 separates the insulating layer 121 from the first data storage cell 124.

A second control gate electrode 132 is adjacent to the electrically insulating layer 121 and the channel region 119. A second data storage cell 134 includes a composite multiferroic layer 135. The second data storage cell 134 separates or is at least partially between the insulating layer 121 from the second control gate electrode 132. An optional second electrically conducting layer 133 separates the insulating layer 121 from the second data storage cell 134.

The size of the first data storage cell 124 and the second data storage cell 134 are substantially the same and posses opposite polarizations to each other. The first control gate electrode 122 can be electrically coupled to a first gate voltage source, 120. The second control gate electrode 132 can be electrically coupled to a second gate voltage source 130. The source region 114 can be electrically coupled to source region voltage source 113 or to ground. The drain region 116 can be electrically coupled to a drain region voltage source 115 or to ground. In many embodiments, these connections can be facilitated in any useful manner such as, for example, via bit lines and/or word lines of the memory device array.

The formation of a junction between the semiconductor and a ferroelectric can create, depending on the polarization direction of the ferroelectric, a state, in which electrons are induced to the semiconductor surface, or a state in which holes are induced. Non-volatile memory devices which hold memory contents even after power-off operation can be formed by using a composite multiferroic layers 125, 135 for the gate insulator film of a MOS field effect transistors and making the two states correspond to "0" and "1". The memory unit 100 of this structure can also be used for an analog memory device. However, for descriptive convenience, the operation will be described by exemplifying a case in which the memory unit 100 is used for a digital memory device. Although not shown, memory units 100 can be arranged in a matrix to form a memory array.

FIG. 5 illustrates composite multiferroic layers 125, 135 including a ferroelectric material 126 in a matrix of a ferromagnetic material 127. These composite multiferroic layers 125, 135 possess a magneto-electric (ME) effect, which means the coupling between electric and magnetic fields and allows for additional degrees of freedom to control electric polarization by magnetic fields or to control magnetization by and electric field. FIG. 5 illustrates composite multiferroic layers 125, 135 where the polarization of the ferroelectric is coupled with the magnetization of the ferromagnetic particles. In other embodiments, the composite multiferroic layers 125, 135 including a ferromagnetic material 127 in a matrix of a ferroelectric material 126, as described above.

In this 1T2C (one transistor two capacitor) embodiment, the electric charges induced to the electrodes of the two data storage cells 124, 134 cancel each other. Thus, no depolarization field is generated in the multiferroic layers 125, 135. In a read operation, voltage is applied to the first control gate electrode 122 and the second first control gate electrode 132 is floating. The drain current is dependent on the polarization of the first storage cell 124 or first composite multiferroic layer 125. In a write operation, an opposite voltage pulse is applied to the first control gate electrode 122 and the second first control gate electrode 132 to switch the polarization of the first storage cell 124 or first composite multiferroic layer 125 and the polarization of the second storage cell 134 or second composite multiferroic layer 135.

The composite multiferroic layers described herein can be formed of any useful materials that possess a magneto-electric (ME) effect, which means the coupling between electric and magnetic fields and allows for additional degrees of freedom to control electric polarization by magnetic fields or to control magnetization by and electric field. In many embodiments these materials include insulating or semiconducting Ni (e.g., Ni ferrite), Co (e.g., Co ferrite), Li (e.g., Li ferrite), Cu (e.g., Cu ferrite), Mn (e.g., Mn ferrite), or YIG (yttrium iron garnet), ferromagnetic material and a $BaTiO_3$, PZT (Pb $(ZrTi)O_3$), PMN (Pb(Mg, Nb)$O_3$), PTO (PbTiO$_3$), or (Sr, Ba)Nb$_2$O$_5$, ferroelectric material. In some embodiments, these materials include a CoZnFe$_2$O$_4$ or NiZnFe$_2$O$_4$ ferromagnetic material and a PZT ferroelectric material. In one embodiment, these materials include a CoFe$_2$O$_4$ ferromagnetic material and a BaTiO$_3$ ferroelectric material. In some embodiment, the composite multiferroic layer includes ferromagnetic nanorods in a matrix of a ferroelectric material or ferroelectric nanorods in a matrix of a ferromagnetic material.

These composite multiferroic layers can be formed by any useful method. In many embodiments, a these composite multiferroic layers are deposited by pulsed laser deposition. These composite multiferroic layers can be grown epitaxial in-plane as well as out-of-plane to any useful thickness such as, for example, from 10 to 250 nm or from 25 to 150 nm, as desired.

The advantages of using the composite multiferroics over the single material ferroelectrics in a FeFET are illustrated as follows: First, the ME coupling between the ferroelectric polarization and the ferromagnetic magnetization works against the depolarization that makes the ferroelectric polarization reverse and relax. Therefore, the ferroelectric polarization is more stable. Second, a calculation utilizing the equation below shows that the depolarization field E is $$E = P\left[\varepsilon\left(\frac{C_{IS}}{C_F} + 1\right)\right]^{-1}$$

where P is the remanent polarization and $\in$ is the dielectric constant of the ferroelectric layer. $C_F$ is the ferroelectric capacitance and $C_{IS}$ represents the capacitance in series with $C_F$ of the insulator on top of the semiconductor. Since capacitance of a capacitor is proportional to its surface area for storing charge, the inclusion of the ferromagnetic material in a matrix of ferroelectric material (or ferroelectric material in a matrix of ferromagnetic material) in the composite multiferroic layer decreases the surface area and then $C_F$. As a consequence, the ratio of $C_{IS}$ with $C_F$ increases and the depolarization field E decreases. This helps stabilize the ferroelectric polarization. Third, epitaxial growth of the composite multiferroics can be achieved. The number of charge traps can be significantly reduced. Current leakage through the traps to compensate the ferroelectric polarization is then reduced. This improves data retention.

Thus, embodiments of the FERROELECTRIC MEMORY USING MULTIFERROICS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A multiferroic memory unit, comprising:
   a substrate having a source region and a drain region;
   an electrically insulating layer adjacent to the substrate;
   a control gate electrode adjacent to the electrically insulating layer and the source region and the drain region; and
   a data storage cell comprising a composite multiferroic layer, the data storage cell is at least partially between the insulating layer and the control gate electrode, and the composite multiferroic layer comprises at least one of, a ferromagnetic material in a matrix of a ferroelectric material, and a ferroelectric material in a matrix of a ferromagnetic material; and
   a second control sate electrode adjacent to the electrically insulating layer, the source region, and the drain region, and a second data storage cell comprising a second composite multiferroic layer, the second data storage cell separates the electrically insulating layer from the second control gate electrode, and the second data storage cell is separated from the data storage cell.

2. A multiferroic memory unit according to claim 1, wherein the composite multiferroic layer comprises ferromagnetic nanorods in a matrix of a ferroelectric material.

3. A multiferroic memory unit according to claim 1, wherein the composite multiferroic layer comprises a Ni ferrite, Co ferrite, Li ferrite, Cu ferrite, Mn ferrite, or YIG, ferromagnetic material and a BaTiO$_3$, PZT, PMN, PTO, or (Sr, Ba)Nb$_2$O$_5$, ferroelectric material.

4. A multiferroic memory unit, comprising:
a substrate having a source region, a drain region and a channel region, the channel region separates the source region and the drain region;
an electrically insulating layer adjacent to the source region, drain region and channel region;
a data storage cell comprising a composite multiferroic layer adjacent to the electrically insulating layer, the composite multiferroic layer comprises a ferromagnetic material in a matrix of a ferroelectric material or a ferroelectric material in a matrix of a ferromagnetic material, the electrically insulating layer separates the data storage cell form the channel region; and
a control gate electrode adjacent to the data storage cell, the data storage cell separates at least a portion of the control gate electrode from the electrically insulating layer; and
a second control gate electrode adjacent to the electrically insulating layer, the source region, and the drain region, and a second data storage cell comprising a second composite multiferroic layer, the second data storage cell separates the electrically insulating layer from the second control gate electrode, and the second data storage cell is separated from the data storage cell.

5. A multiferroic memory unit according to claim 4, wherein the composite multiferroic layer comprises a ferromagnetic material in a matrix of a ferroelectric material.

6. A multiferroic memory unit according to claim 4, wherein the composite multiferroic layer comprises a ferroelectric material in a matrix of a ferromagnetic material.

7. A multiferroic memory unit according to claim 4, wherein the composite multiferroic layer comprises ferromagnetic nanorods in a matrix of a ferroelectric material.

8. A multiferroic memory unit according to claim 4, wherein the composite multiferroic layer comprises a Ni, Co, Li, Cu, Mn, or YIG, ferromagnetic material and a $BaTiO_3$, PZT, PMN, PTO, or $(Sr, Ba)Nb_2O_5$, ferroelectric material.

9. A multiferroic memory unit according to claim 4, wherein the composite multiferroic layer comprises a $CoZnFe_2O_4$ or $NiZnFe_2O_4$ ferromagnetic material and a PZT ferroelectric material.

10. A multiferroic memory unit according to claim 4, wherein the composite multiferroic layer comprises a $CoFe_2O_4$ ferromagnetic material and a $BaTiO_3$ ferroelectric material.

11. A multiferroic memory unit according to claim 4, further comprising an electrically conducting layer separating the composite multiferroic layer from the electrically insulating layer.

12. A multiferroic memory unit according to claim 4, wherein the composite multiferroic layer contacts the electrically insulating layer.

* * * * *